United States Patent
Trayling et al.

(10) Patent No.: US 7,394,233 B1
(45) Date of Patent: Jul. 1, 2008

(54) HIGH EFFICIENCY MODULATED POWER SUPPLY

(75) Inventors: Ken Trayling, London (GB); Graham Dolman, Saffron Walden (GB); Richard Emmerson, Bishops Stortford (GB)

(73) Assignee: Nortel Networks Limited, St. Laurent, Quebec (CA)

( * ) Notice: Subject to any disclaimer, the term of this patent is extended or adjusted under 35 U.S.C. 154(b) by 496 days.

(21) Appl. No.: 11/001,919

(22) Filed: Dec. 2, 2004

(51) Int. Cl.
*G05F 1/40* (2006.01)
*H03G 3/00* (2006.01)

(52) U.S. Cl. .................. 323/272; 323/240; 323/282; 330/127

(58) Field of Classification Search .......... 323/225, 323/237, 240, 272, 282, 283; 330/127, 279, 330/129; 455/572
See application file for complete search history.

(56) References Cited

U.S. PATENT DOCUMENTS

| | | | |
|---|---|---|---|
| 6,760,303 B1* | 7/2004 | Brouwer | 370/229 |
| 6,954,415 B2* | 10/2005 | Masui et al. | 369/59.11 |
| 7,034,617 B2* | 4/2006 | Takahashi et al. | 330/279 |

* cited by examiner

*Primary Examiner*—Jessica Han

(57) ABSTRACT

A modulated power supply comprises a power switching stage having at least one power switching device for generating a power signal in response to an input modulating signal. A current source is positioned in parallel with the power switching stage and continuously generates an output current. An output stage combines the power signal and the output current to form an output power supply signal. The current source supplies some, or all, of the required current at any given time. The switching device in the power switching stage either supplies the remaining required current or sinks any excess current. This has an advantage of reducing the average and peak currents flowing through the switching device, and hence the average power dissipation in the device. The output current can be set at an average (e.g. RMS) value of the current in the output power supply signal.

10 Claims, 5 Drawing Sheets

HIGH EFFICIENCY MODULATED POWER SUPPLY

FIELD OF THE INVENTION

This invention relates to modulated power supplies and to a method of generating a power supply signal.

BACKGROUND TO THE INVENTION

Modulated power supplies, such as Pulse Width Modulated (PWM) power supplies, are widely used in a variety of applications. In a PWM power supply a power switching device, such as a power transistor, is turned on and off at a high frequency, with the width of the 'on' periods varying in sympathy with the amplitude of a modulating input signal. The resulting train of output pulses from the switching device is smoothed by a low pass filter to deliver a supply voltage which varies in sympathy with the modulating input signal.

A PWM power supply can have a single phase or multiple phases, with the contributions of individual phases summing to provide an overall output. Multi-phase PWM power supplies have an advantage over single phase PWM supplies in that they can deliver better resolution in the time domain and increased current.

One known application of a modulated power supply is in supplying power for a linear RF power amplifier. An envelope of the RF signal which is to be amplified is used as a modulating signal for the power supply and the resulting, modulated, power supply signal is fed to the power amplifier. In this way, the power supply signal follows the envelope of the signal to be amplified and the efficiency of the linear power amplifier can be improved.

For high frequency (e.g. RF) power supply applications small, fast, switching devices are required in each phase, such as Laterally Diffused Metal Oxide Semiconductor (LDMOS) transistors. These devices have a small junction, which results in them having a relatively high resistive loss during the periods that they are switched on. This high resistive loss incurs power losses and generates heat which must be dissipated to prevent device failure.

Accordingly, the present invention seeks to improve the performance of a modulating power supply particularly, but not limited to, situations where the modulating signal has a wide bandwidth.

SUMMARY OF THE INVENTION

A first aspect of the present invention provides a modulated power supply comprising:

a power switching stage having at least one power switching device for generating a power signal in response to an input modulating signal;

a current source which is operable to continuously generate an output current, the current source being positioned in parallel with the power switching stage; and, an output stage which combines the power signal and the output current to form an output power supply signal.

In this arrangement the current source supplies some, or all, of the required current at any given time. The switching device in the power switching stage either supplies the remaining required current or sinks any excess current. This has an advantage of reducing the average and peak currents flowing through the switching device, and hence the average power dissipation in the device. Ideally, the average current in the power switching device should tend to zero. Operating in this manner also has an advantage of reducing the operating temperature of the switching device which leads to improved reliability and simplified heat sinking requirements. There are cost savings arising from the reduced power consumption, simplified heat sinking requirements and improved reliability. Operating switching devices at a lower junction temperature also lowers the on-resistance. The reduction in peak current can result in a more linear transfer function or can allow the use of smaller switching devices with lower capacitance and therefore lower capacitive loss. The power supply can use several switching devices per power switching stage, and there can be a plurality of power switching stages (phases) in parallel with one another.

The current source continuously generates an output current as long as it is efficient to do so. In a power supply which is required to operate over a range of output power levels it has been found that it can be undesirable to use the current source at the lowest power levels as it may require the switching device in the power switching stage to sink an undesirably large amount of current.

Preferably, the output current of the current source is set at a value which achieves best overall system power efficiency. This can be a current which is at, or close to, the average value of the current in the output power signal, such as the root mean square (RMS) value of the current in the output power signal. Preferably, the current source is controllable such that it tracks the average value of the current in the output power signal.

The current source can be implemented as a power converter which has at least one power switching device. It is preferable that the power switching device used within the power converter has a lower resistive loss than the power switching device used within the power switching stage. This is possible because the power converter will operate at a lower switching frequency than the main power switching stage.

The power supply can be used in a wide range of applications. It is particularly well-suited to wireless telecommunications base stations where power amplifiers in the transmit chains are required to amplify a signal having a wide bandwidth. This is particularly true in third generation Universal Mobile Telecommunications System (UMTS) base stations. The input modulating signal to the power supply can be an envelope of a signal to be transmitted and the output of the power supply can form the power supply to a power amplifier, so that the power supply tracks the envelope of the input signal. Power costs are one of the most significant operating costs of a base station and thus and reduction in these can yield considerable savings. The invention is not limited to communication systems. Any application requiring modulation of voltage or current that has a significant DC component in the signal will benefit. The invention can improve overall power efficiency, linearity, modulator size, cost and reliability.

The power supply can include a single power switching stage or multiple power switching stages which are operated in parallel with one another as a group of phases. Each power switching stage can be operated in a pulse width modulated (PWM) manner or alternatively as a pulse density modulated (PDM) or a Sigma Delta Modulated (SDM) manner.

Further aspects of the invention provide a power amplifier which includes such a modulated power supply, a wireless base station comprising the power amplifier, a method of generating a power supply signal and a power supply signal resulting from this method.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
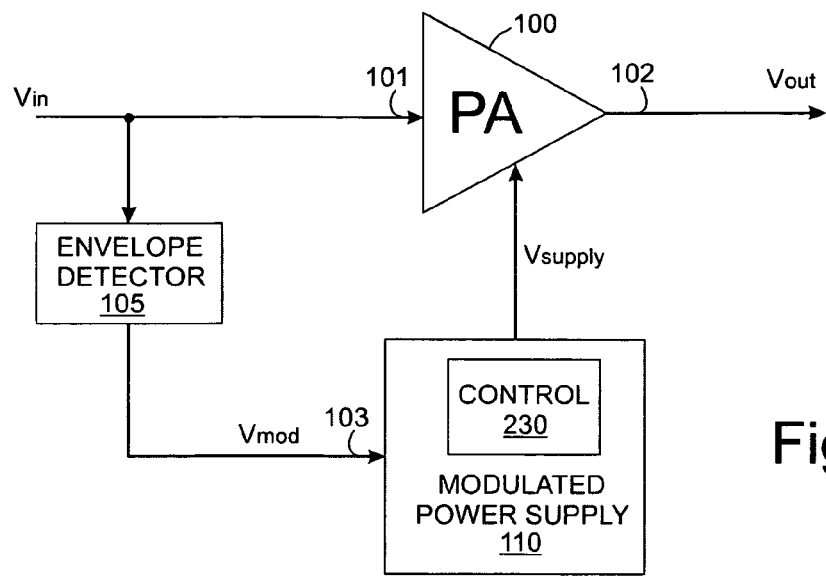
FIG. 1 shows a modulated power supply for use with a power amplifier.
Figure 2:
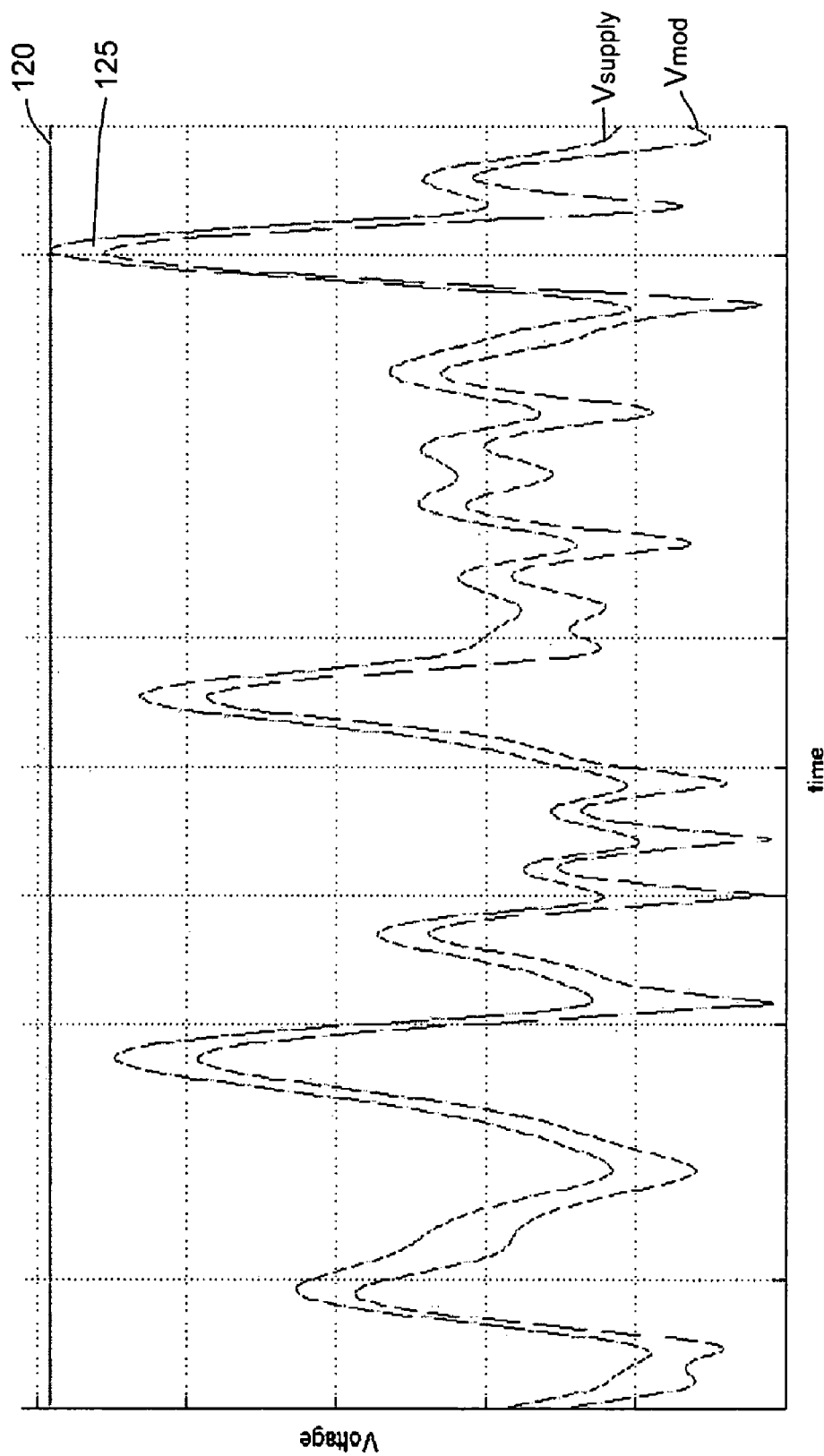
FIG. 2 shows operation of the arrangement of FIG. 1.

Before describing the invention in detail, FIGS. 1 and 2 illustrate an application of the invention in order to put the invention into context. FIG. 1 shows a power amplifier arrangement comprising a power amplifier 100 and a modulated power supply 110. An input signal Vin, which is to be amplified by the power amplifier 100, is also applied to an envelope detector 105. A signal, Vmod, representing the envelope of the input signal is applied to an input 103 of the modulating power supply 110. A control circuit 230 within the modulating power supply 110 receives the signal Vmod and determines appropriate control signals which cause the power supply 110 to generate a supply voltage Vsupply which substantially tracks Vmod. An amplified output signal Vout is taken from an output 102 of the power amplifier 100. FIG. 2 shows the operation of the power supply over a period of time, showing the envelope of the input signal Vmod and the envelope of the dynamically modulated power supply voltage Vsupply. It can be seen that the power supply voltage tracks the signal envelope, including peaks 125. As a comparison, the power supply voltage of a fixed supply is shown by line 120.

Figure 3:
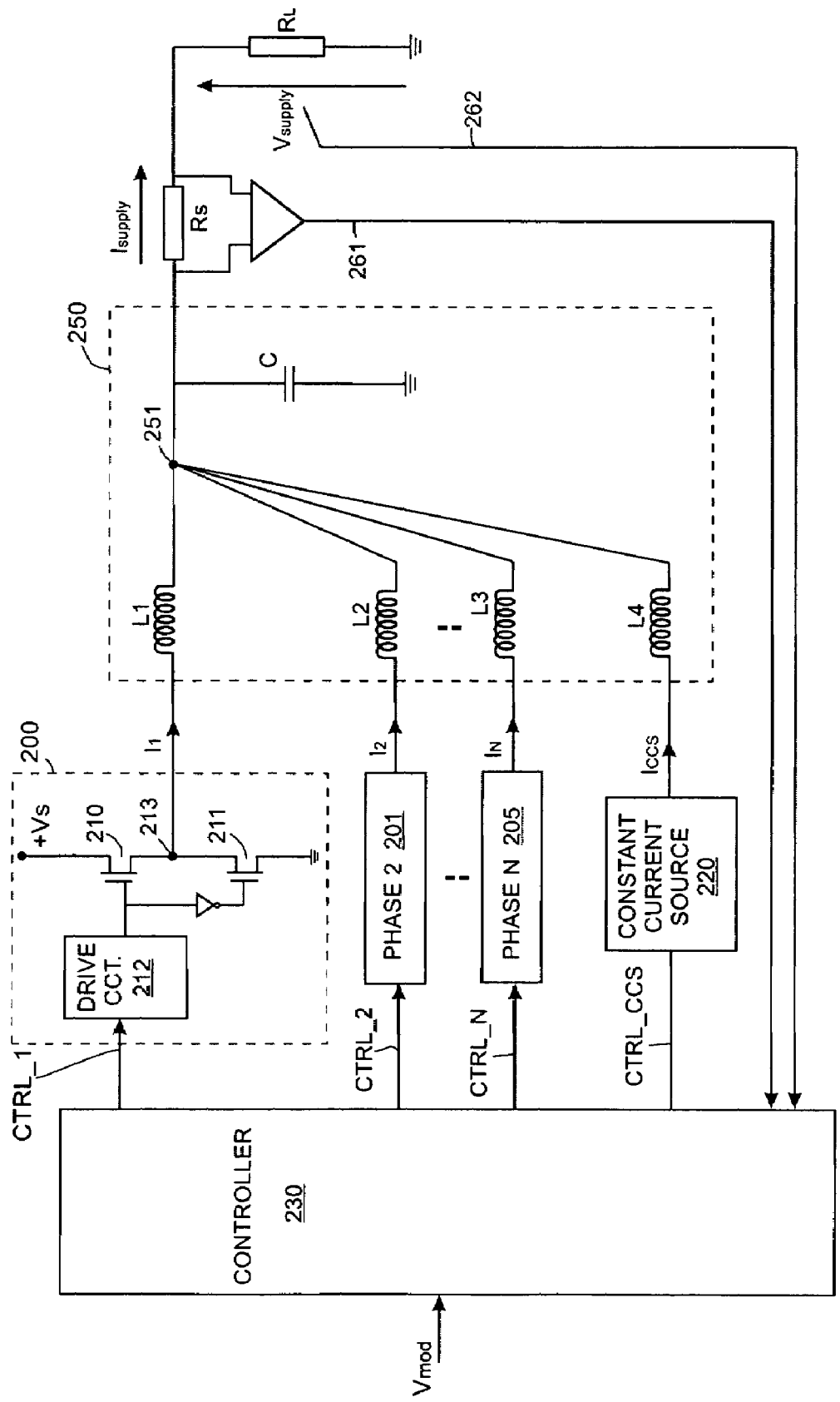
FIG. 3 shows an embodiment of a modulated power supply.

In the following embodiments the modulating power supply 110 is a pulse width modulated (PWM) converter, and preferably a multi-phase PWM converter. FIG. 3 shows the main blocks within a multi-phase PWM converter 110 with N phases. Phase 1 200 is shown in detail and other phases 201, 205 have the same layout. Each phase includes two power switching devices 210, 211 which can be a Field Effect Transistor (FET), Laterally Diffused Metal Oxide Semiconductor (LDMOS) transistor or any other suitable switching device. A first switching device 210 is connected between a positive supply rail +Vs and an output node 213. A second switching device 211 is connected between the output node 213 and ground. Each phase also includes a drive circuit 212. The control signal output by PWM controller 230, which is typically implemented as a FPGA, is at a low level which is unsuitable for directly driving the switching devices 210, 211. Therefore, drive circuit 212 converts the control signal to a suitable level for driving the switching devices 210, 211. It will be appreciated that this topology of switching devices is only shown as an example and variants will be well known to a skilled person.

PWM controller 230 receives a signal Vmod indicative of the required output voltage/current and generates a set of control signals CTRL_1, CTRL_2, CTRL_N which are applied to the switching devices in each of the phases 200, 201, 205. In a known manner, each control signal has pulses with an 'on' time related to the required output signal. In a multi-phase supply, each of the N phases receives a control signal in which the pulses are offset in time from the pulses applied to other phases. The resulting output of each phase is a stream of pulses which vary in width, the average level of the pulse stream representing a desired output level.

The respective outputs $I_1, I_2, I_N$ of each phase 200, 201, 205 are summed and low-pass filtered in an output stage 250. Each phase 200, 201, 205 is connected in series with an inductor L1, L2, L3 and the remote ends of the inductors L1, L2, L3 are commonly connected to a summing node 251. A capacitor C is shunted across the output. The combination of inductors L1, L2, L3 and capacitor C have the effect of low-pass filtering the outputs of the phases, turning the pulsed outputs of individual phases into a summed, smoothed, output signal Vsupply having the form shown in FIG. 2. So far, the arrangement of FIG. 3 is conventional. According to an embodiment of the invention, a constant current source 220 is placed in parallel with the phases 200, 201, 205. The constant current source (CCS) 220 generates a current at a value Iccs. The value Iccs can be permanently fixed, or can be varied as described below. It should be noted that the value of Iccs does not vary in sympathy with the modulating signal, and any variation is controlled at a much slower rate than the power switching stages 200, 201, 205. In the same manner as the phases 200, 201, 205, the constant current source 220 is connected in series with an inductor L4 and the output of the inductor L4 is connected to summing node 251. To preserve the filter characteristic it can be beneficial to use L1=L2=L3=L4 and also provide some small capacitance, similar to that of a pair of VMOD FETs 210, 211, in series with L4. An additional large inductor (>100 µH) should be used to de-couple the current source from the filter and provide quasi-DC conditions at the current source.

PWM controller 230 supplies a control signal CTRL_CCS which sets the value of Iccs. In an ideal implementation where the power switching stage(s) 200, 201, 205 track the signal envelope (Vmod, FIG. 2) perfectly, the current source would need very little control, and would simply maintain an output current at a constant value. In a preferred embodiment where the static power output level is variable (e.g. to satisfy the different power demands of the RF amplifier 100 at different transmit power levels) it is necessary to provide a slow control loop to adjust the output current of the current source so as to maintain best overall power efficiency.

At the lowest output power levels it may be more efficient to turn the current source off. The current level used at each power level is preferably pre-determined, based on what is known to be required, but the actual value can be adjusted as necessary during operation based on monitoring the output current, shown as feedback loop 261 in FIG. 3. The provision of the current source 220 does not require any significant changes to the control functions of the power switching stages 200, 201, 205. The switching devices 210, 211 in the power switching stages 200, 201, 205 are non-ideal devices and have impairments such as $I^2R$ loss and pulse rise & fall times. The level of these impairments may be slightly changed by the addition of the current source to the power supply and it is desirable to control these impairments by feeding back a sample of the output voltage Vsupply, shown as feedback loop 262 in FIG. 3.

One particularly advantageous value of Iccs is the root mean square (RMS) value of the output signal Isupply, although the invention is not limited to this value. The effect of operating in this way will now be illustrated with reference to FIG. 4, which shows overall output current Isupply of the power supply over a period of time. During this time period Isupply 300 varies about a rms value Irms. It is assumed that the constant current source generates a current Iccs which is set to this rms value. The combination of the individual currents ($I_1$, $I_2$, $I_N$) generated by each modulated phase 200, 201, 205 together generate a current Imod. During the periods when the total required output current is greater than the rms value, shown as +ve in FIG. 4, the total output current is:

$$I_{supply} = I_{ccs} + I_{mod}$$

i.e. the modulated phase(s) only supply a current which is the difference between the output of the constant current supply and the required value.

Figure 4:
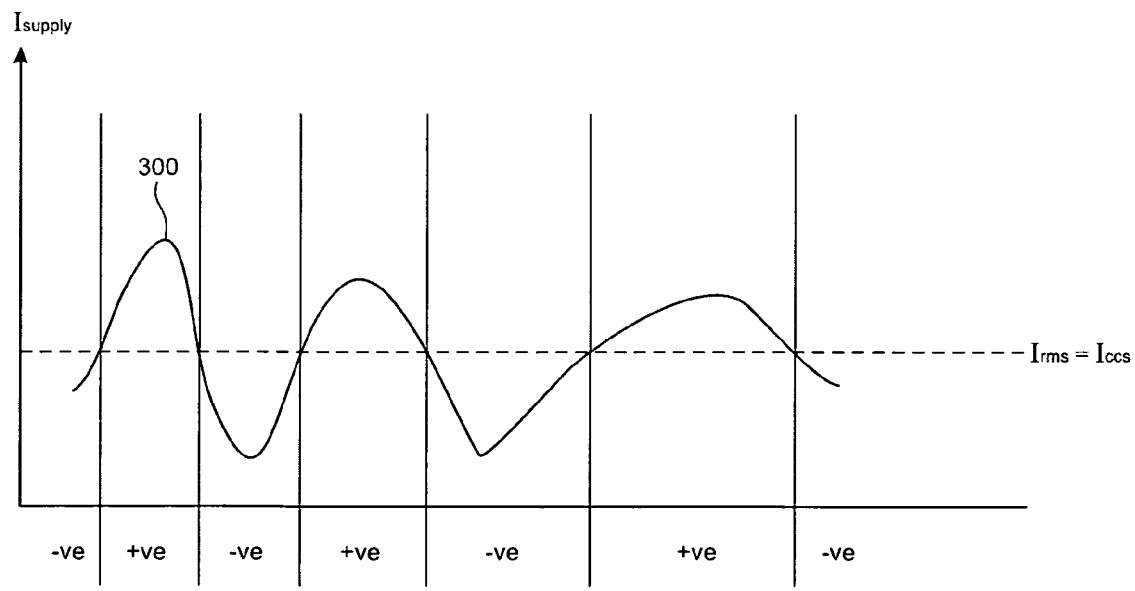
FIG. 4 shows current flow through the supply of FIG. 3 over a period of time.
Figure 5:
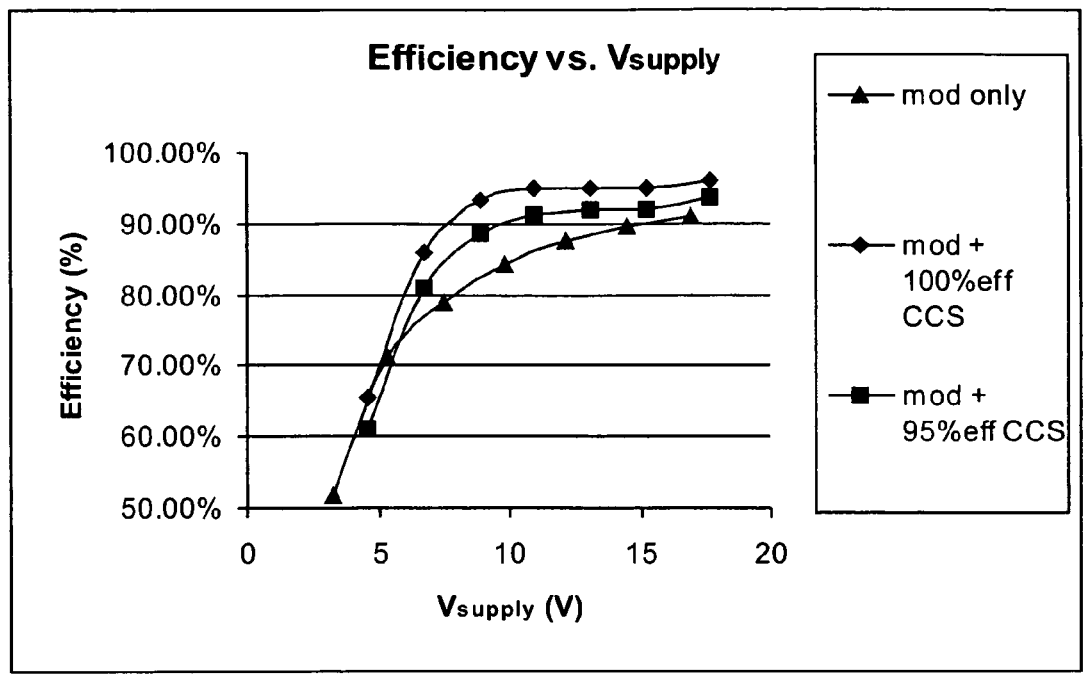
FIG. 5 shows a graph which compares the efficiency of the modified power supply with a conventional power supply.

Similarly, during the periods when the total output current is less than the rms value, shown as −ve in FIG. 4, the total required output current is:

$$I_{supply} = I_{ccs} - I_{mod}$$

i.e. the excess current, amounting to the difference between the output of the constant current source and the required output value is sunk by the modulated phase(s) and is returned to the supply. The primary source of power losses in the switching devices 211, 212 of the modulator phases 200, 201, 205 are resistive power losses between the drain and source of the devices during the time that the devices are switched on ($R_{ds-on}$). The resistive power losses are governed by the relationship $I^2 \cdot R_{ds\_on}$. Since a smaller current is now passing through the switching devices in the phases 200, 201, 205 the overall power dissipation in the power switching devices is significantly reduced. This has also been found to reduce the operating temperature of the devices, which further reduces their operating resistance ($R_{ds\_on}$) and the associated power dissipation. FIG. 5 shows a graph which compares the efficiency of a conventional power supply having only modulated phases, with a power supply having a constant current source in the manner just described. This graph does not take into account the effects of temperature, which would further improve the efficiency of the power supply using a constant current source. The trace "mod+100% eff CCS" is a baseline efficiency for a system with an ideal (but not feasible) 100% efficient current source and the trace "mod+95% eff CCS" is an efficiency contour for a system with a feasible 95% efficient current source.

Figure 6:
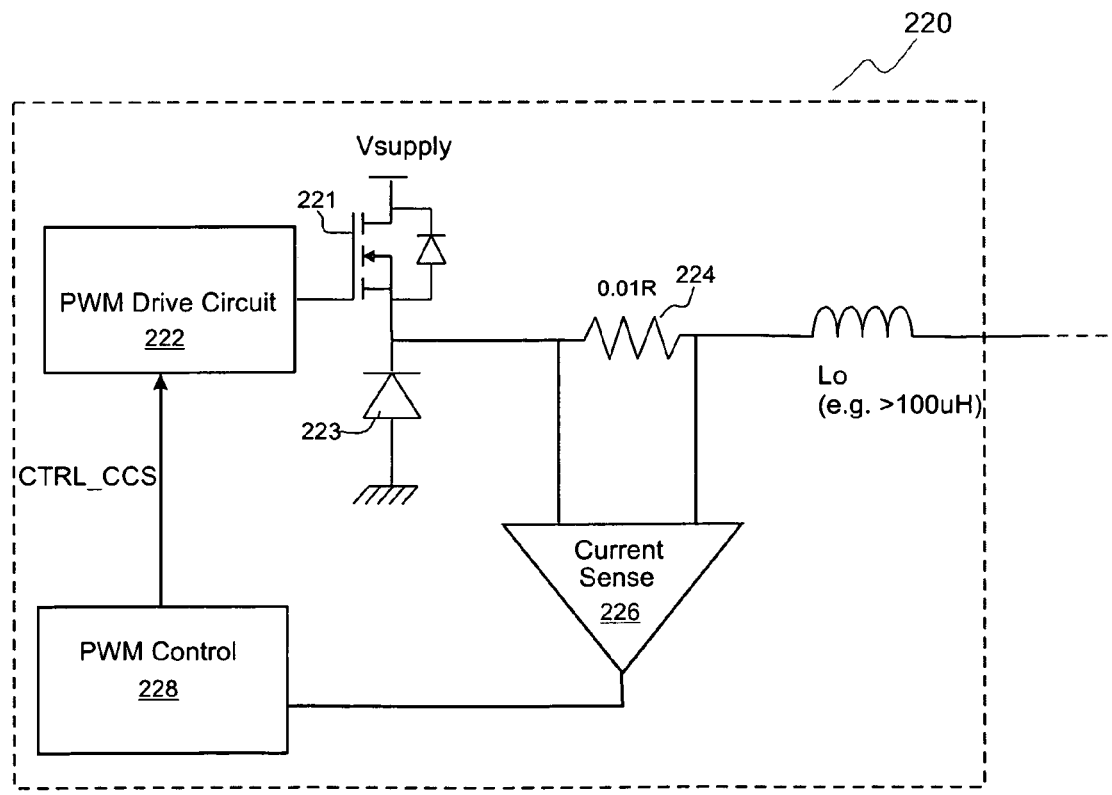
FIG. 6 shows an example constant current source.

One way of achieving a current source is by using a switched mode power supply. FIG. 6 shows an example form of switched mode power supply (SMPS) which is suitable for use as a current source. In a similar manner to one of the phases 200, the current source 220 includes a power switching device 221 such as a power switching FET which is placed in series with a rectifier diode 223 or a synchronous rectifier switch between ground and a supply rail Vsupply. The FET 221 is driven by a drive circuit 222 which receives a control signal CTRL_CCS from a PWM control unit 228. Although shown as part of the current source 220, the control unit 228 can form part of the overall controller 230 of the power supply. A current sensing loop comprises a current sensing resistor 224 placed in series with the output and a differential amplifier 226 which senses the voltage across the sensing resistor 224. The sensed voltage at 226 is fed to the PWM control unit 228. The PWM control unit 228 adjusts the width of the PWM control signal CTRL_CCS according to the sensed current so as to maintain the output current at a desired value.

The switching device(s) 221 used in the SMPS usually operate in the frequency range of 10-100 kHz which allows the use of switching devices having an on resistance in the range 1-10 mΩ. In contrast, in wideband RF applications the switching devices in the modulator phases 200, 201, 205 are commonly required to operate at a switching speed of >10 MHz, which requires specialised low capacitance switching devices having an on resistance of around 1Ω. It can be seen that the use of a SMPS with switching devices having a lower resistance is more efficient than operating modulated phases with higher resistance switching devices. The reduced peak current flowing in the switching devices of the modulated phase allows those devices to operate in a region where their transfer function is more linear. Also, the reduction in junction temperature reduces the value of $R_{ds\_on}$, which further reduces resistive losses. It has been found that a reduction in junction temperature of 50° C. can reduce $R_{ds\_on}$ by 20%. The current source shown in FIG. 6 is a switching current source, i.e. it uses a switching device. An alternative form of current source is a linear type although linear current sources are generally only efficient over a narrow range of current. For an application where the output power can take a range of possible values (e.g. a range of 21 dB in the case of a power amplifier for a base station) a switch-mode current source offers superior power efficiency.

It will be well understood that the functions of the control stage 230 can be implemented by software which is executed by a processor, by hardware such as a FPGA or dedicated integrated circuit, or a combination of these.

The techniques described herein are applicable to the control of modulated power supplies used in a wide range of applications. One particularly suitable application is a base station of a wireless communications system which processes wideband signals such as CDMA, wideband CDMA (W-CDMA) and Orthogonal Frequency Division Multiplexed (OFDM).

Figure 7:
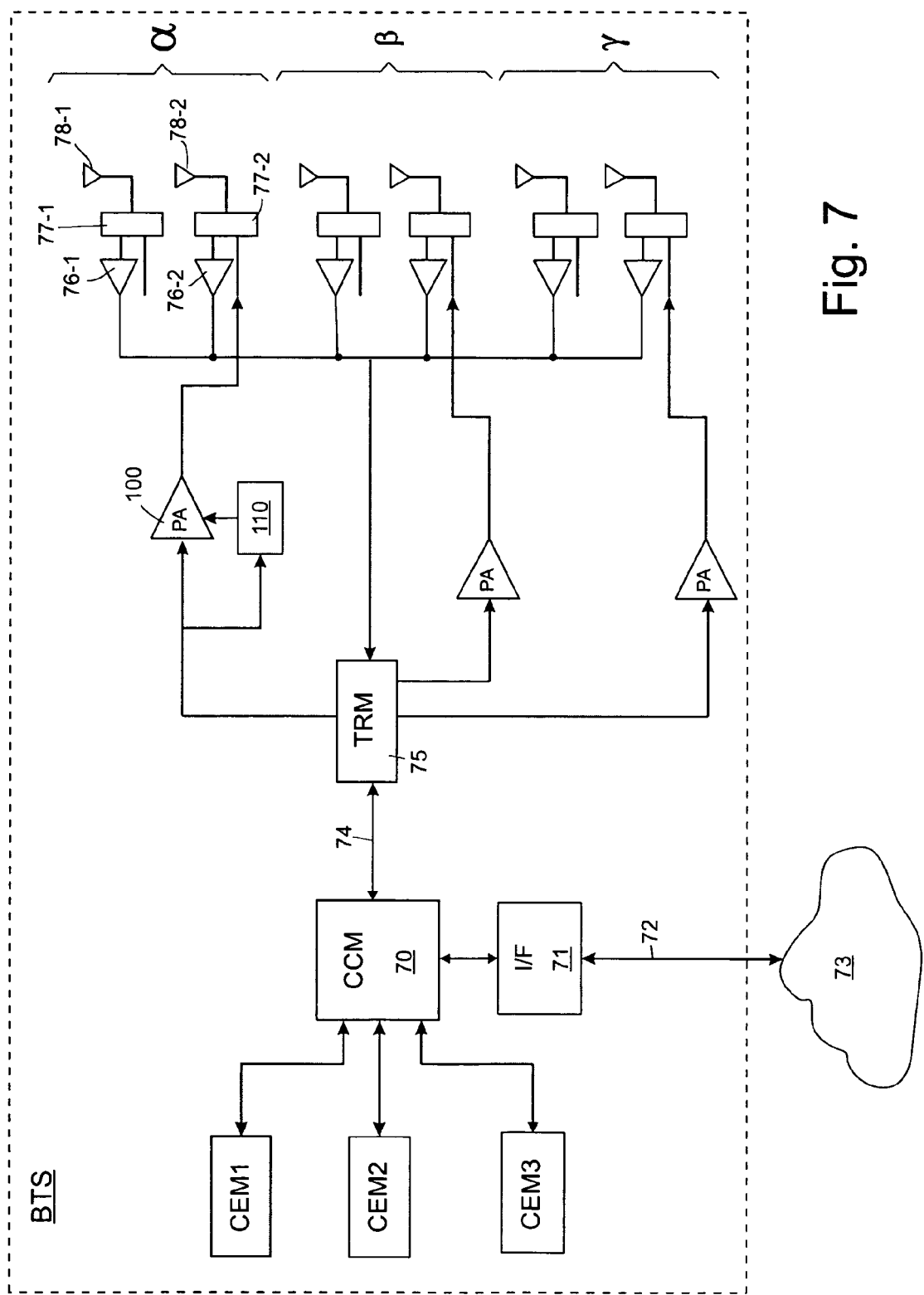
FIG. 7 shows a wireless communications base station incorporating the modulated power supply.

FIG. 7 schematically shows a base station for a wireless communications system, in which the invention can be applied. The baseband section of the base station BTS includes a core switch CCM 70, an interface 71 to the operator's network 73 and a plurality of signal processing units CEM1, CEM2, CEM3. Signals in Packet Data Format including user messages and control signals may be provided on a connection 72 between the network 73 and the BTS, the signals being received at the interface 71 and passed from there to the core switch CCM 70. The core switch 70 is responsible for controlling the complete operation of the transmission and reception of signals to and from the antennas 78 and to and from the signal processing units CEM1, CEM2, CEM3 and the interface 71. The signal processing units undertake baseband signal processing. The core switch CCM 70 is connected 74 to a transceiver unit TRM 75. Transceiver unit TRM 75 performs digital to analog conversion and up-conversion to RF for signals to be transmitted, and performs down-conversion from RF and analog-to-digital conversion on received signals. The arrangement shown has three sectors: α, β and γ. In a typical arrangement, different signals will be transmitted in each sector α, β, γ, e.g. in sector α a signal from a transmit unit in TRM 75 is amplified by power amplifier 100, passed through duplexer 77-2 and transmitted from antenna 78-2. As previously described with respect to FIG. 1, an envelope detector 105 receives the signal which is to be transmitted and detects the envelope of it. The envelope signal forms a modulating signal for the modulated power supply 110. The resulting output from the modulated power supply forms the power supply to the power amplifier 100 such that the power supply tracks the envelope of the signal which is to be transmitted.

The invention is not limited to the embodiments described herein, which may be modified or varied without departing from the scope of the invention.

We claim:

1. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the amplifying device has an input for receiving an input signal for amplification, wherein an envelope level of the input signal is fed to the power supply as the modulating input signal and the output level of the power supply forms a power supply to the power amplifier.

2. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the output current is set at a value which provides optimum overall power efficiency for the power supply.

3. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the output current is set at an average value of the current in the output power supply signal.

4. A power amplifier according to claim 3 wherein the output current is set at the root mean square (RMS) current of the output power supply signal.

5. A power amplifier according to claim 3 further comprising a control loop which is operable to determine the average value of the current in the output power supply signal and to control the output current of the current source according to the determined current.

6. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the switching stage is operable over a range of output power levels and the current source is operable to generate an output current at a plurality of predetermined values, each output current being associated with an output power level.

7. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the output stage comprises a first inductor in series with the power switching stage, a second inductor series with the current source and a common node to which both of the inductors are connected.

8. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the current source comprises a power converter which has at least one power switching device, and wherein the power switching device within the power converter has a lower resistive loss than the power switching device used within the power switching stage.

9. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the modulated power supply is arranged to operate the power switching device in one of: a pulse width modulated (PWM), a pulse density modulated (PDM) and a Sigma Delta Modulated (SDM) manner.

10. A power amplifier for use in radio communications comprising an amplifying device and a modulated power supply, the modulated power supply comprising:
a power switching stage having at least one power switching device for generating a power signal in response to an input modulating signal;
a current source which is operable to continuously generate an output current, the current source being positioned in parallel with the power switching stage; and,
an output stage which combines the power signal and the output current to form an output power supply signal;
wherein the modulating input signal is an envelope of a signal for processing by a power amplifier and the output level of the power supply forms a power supply of the power amplifier.

* * * * *